United States Patent [19]

Yarita et al.

[11] Patent Number: 5,013,402
[45] Date of Patent: May 7, 1991

[54] METHOD OF MANUFACTURING DOUBLE-SIDED WIRING SUBSTRATE

[75] Inventors: Yoshio Yarita, Mizuho; Yoshihiro Kawamura, Fussa, both of Japan

[73] Assignee: Casio Computer Co., Ltd., Tokyo, Japan

[21] Appl. No.: 555,058

[22] Filed: Jul. 18, 1990

Related U.S. Application Data

[63] Continuation-in-part of Ser. No. 464,410, Jan. 12, 1990, Pat. No. 4,964,947.

[30] Foreign Application Priority Data

Jan. 20, 1989 [JP] Japan ................... 1-11366
Jan. 30, 1989 [JP] Japan ................... 1-20623

[51] Int. Cl.5 .......................... C23F 1/02; B44C 1/22; C03C 15/00; C03C 25/06
[52] U.S. Cl. ..................... 156/645; 156/656; 156/661.1; 156/902; 427/97; 29/852; 204/38.4
[58] Field of Search ............. 156/640, 643, 645, 652, 156/656, 659.1, 661.1, 664, 665, 666, 902; 29/846, 852; 427/97; 174/68.5; 204/38.4

[56] References Cited

U.S. PATENT DOCUMENTS

| | | | |
|---|---|---|---|
| 2,848,359 | 8/1958 | Talmey | 427/97 X |
| 2,849,298 | 8/1958 | Werberig | 156/634 |
| 3,134,690 | 5/1964 | Eriksson | 427/97 X |
| 3,154,478 | 10/1964 | Lee | 204/15 |
| 3,625,758 | 12/1971 | Stahl | 174/68.5 X |
| 3,854,973 | 12/1974 | Mersereau et al. | 427/97 X |
| 4,217,182 | 8/1980 | Cross | 204/15 |
| 4,303,798 | 12/1981 | Paunovic | 174/68.5 |
| 4,561,931 | 12/1985 | Ritt et al. | 156/640 |
| 4,608,274 | 8/1986 | Wooten | 427/96 |
| 4,682,415 | 7/1987 | Adell | 156/233 X |
| 4,756,795 | 7/1988 | Bakos et al. | 156/645 |
| 4,770,900 | 9/1988 | Seibel | 427/97 |
| 4,870,751 | 10/1989 | Antoon | 29/846 |
| 4,964,947 | 10/1990 | Yarita et al. | 156/902 X |

FOREIGN PATENT DOCUMENTS 60-208888 10/1985 Japan.
60-208894 10/1985 Japan.
WO88/03443 5/1988 PCT Int'l Appl..

Primary Examiner—William A. Powell
Attorney, Agent, or Firm—Frishauf, Holtz, Goodman & Woodward

[57] ABSTRACT

Disclosed is a method of manufacturing a double-sided wiring substrate wherein wiring patterns having a low resistivity are formed on both surfaces of a substrate. A pin hole is formed in a thin insulating film having excellent durability by a pin. A thin metal film is formed on the upper and lower surfaces of the insulating film and the inner wall of the pin hole by vacuum deposition. A thick metal film is formed on the entire thin metal film by electroplating. Thereafter, portions of the thin and the thick metal films formed on the upper and lower surfaces of the insulating film are etched while leaving a portion of them on the inner wall of the pin hole. Conductive patterns each having a layered structure of the thin and the thick metal films are thus formed on the upper and lower surfaces of the substrate. The "roll-to-roll system" that is, every step of manufacturing is performed by unrolling and feeding the insulating film rolled up around the roll, can also be applied. This enables to make the productivity extremely efficient.

12 Claims, 10 Drawing Sheets

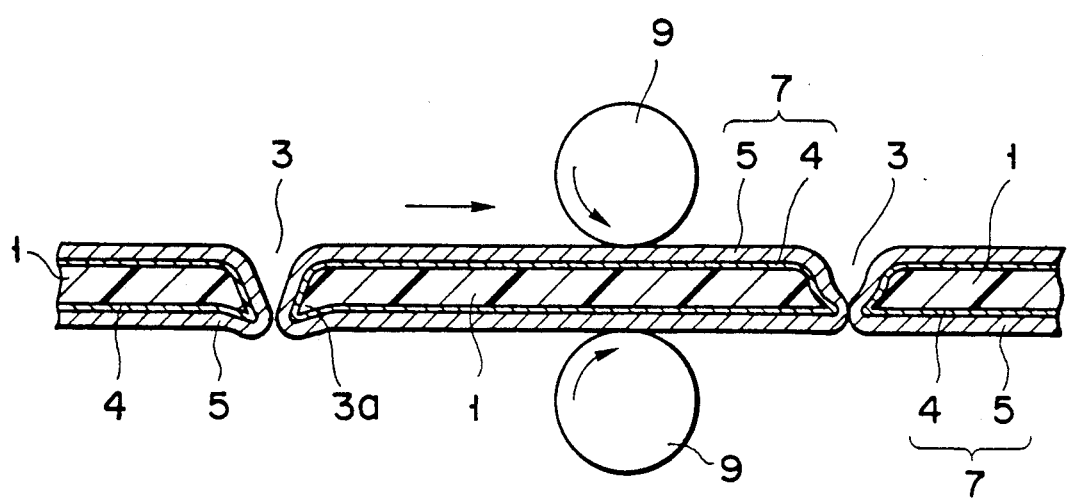
F I G. 3

F I G. 4A 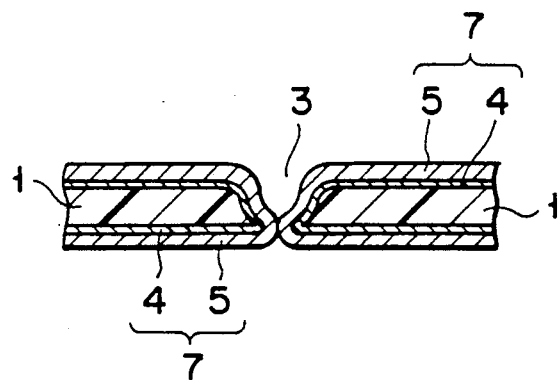
F I G. 4B 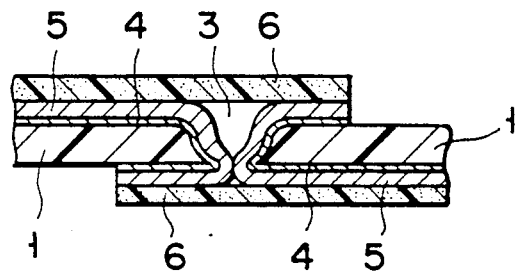
F I G. 4C 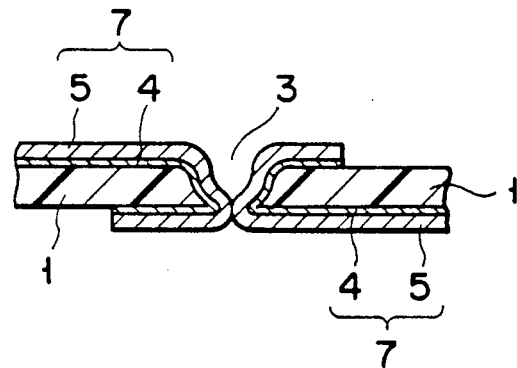

F I G. 5E
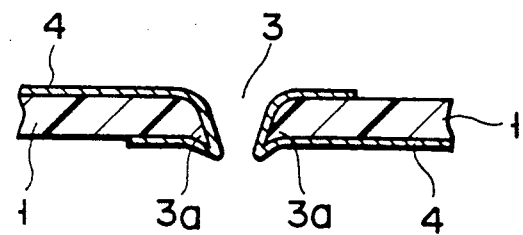
F I G. 5F
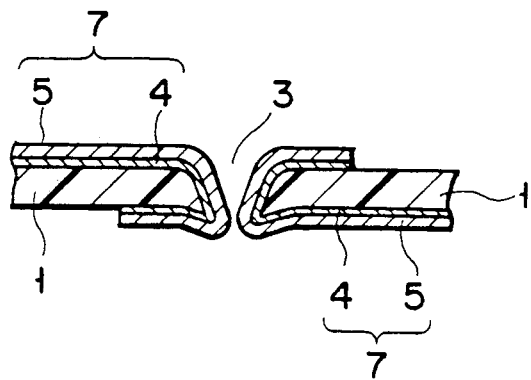
F I G. 5G
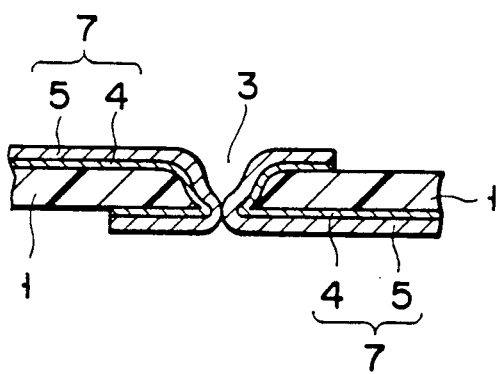

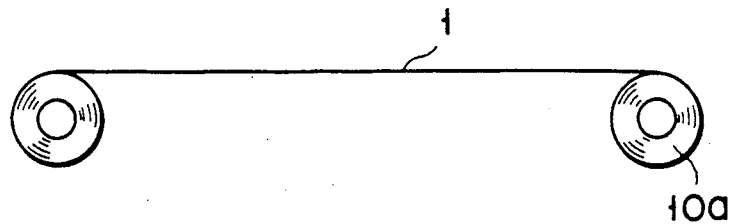
FIG. 6A
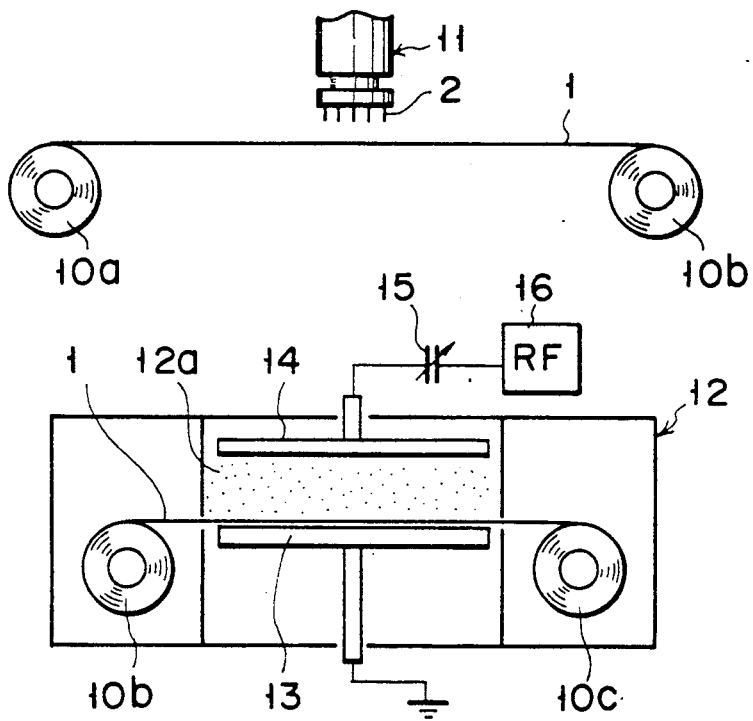
FIG. 6B
FIG. 6C
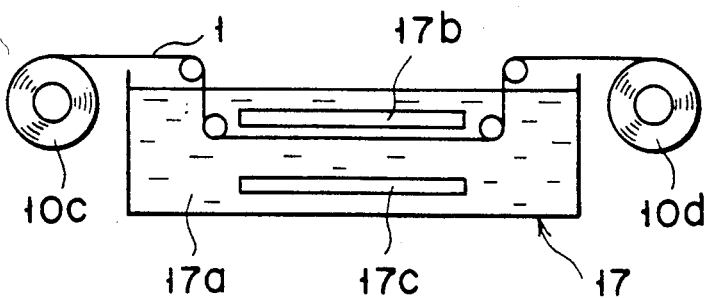
FIG. 6D

METHOD OF MANUFACTURING DOUBLE-SIDED WIRING SUBSTRATE

CROSS-REFERENCE TO THE RELATED APPLICATION

This application is a continuation-in-part of application Ser. No. 464,410 filed on Jan. 12, 1990, now U.S. Pat. No. 4,964,947, issued Oct. 23, 1990.

BACKGROUND OF THE INVENTION

1. Field of the Invention

The present invention relates to a method of manufacturing a double-sided wiring substrate and, more particularly, to a method of efficiently forming fine wiring patterns having a low resistance on both surfaces of a substrate.

2. Description of the Related Art

In a conventional double-sided wiring substrate having surfaces on both of which electric conductive patterns hereinafter wiring patterns are respectively formed, a through hole which extends from the upper surface to the lower surface of the substrate is formed by, e.g., punching or drilling, and a metal such as copper is plated on the inner wall of the through hole to connect the wiring patterns formed on both the surfaces. In such a method, however, a metal such as copper cannot be directly plated on the inner wall of the through hole, and hence a pretreatment or under-coating treatment must be performed in advance for the inner wall of the through hole. Therefore, the plating process is complicated, and manufacturing cost is undesirably increased.

Recently, the following method has been considered. That is, after a substrate is pierced with a metal pin to form a pin hole which extends from the upper surface to the lower surface, the pin hole is filled with an electric conductive paste to connect wiring patterns respectively formed on the upper and lower surfaces. The above technique is disclosed in Published Unexamined Japanese Patent Application Nos. 60-208888 and 60-208894.

In the technique disclosed in the above applications, a carbon ink is used as an electric conductive paste. Since the carbon ink has a high electric resistivity, it cannot be applied to a low-resistance circuit. In addition, as is conventionally known, when a conductive pattern is formed with the carbon ink, it may often be stained or blurred to disable formation of fine wiring patterns.

SUMMARY OF THE INVENTION

It is, therefore, an object of the present invention to provide a method of manufacturing a double-sided wiring substrate which can form fine electric conductive patterns having a low resistance, and allows efficient manufacture.

In order to achieve the above object according to the present invention, there is provided a method of manufacturing a double-sided substrate comprising the steps of:

providing an insulating film rolled up in a reel;
unrolling and feeding intermittently said insulating film;
forming a hole in said insulating film by a pin;
forming a thin metal film on upper and lower surfaces of said insulating film and a inner wall of the hole by deposition;
forming a thick metal film on said thin metal film by plating;
etching a predetermined portion of said thin and thick metal films formed on said upper and lower surfaces of said insulating film to form a conductive patterns having a layered structure of said thin and thick metal films, and conductive patterns extending form said inner wall of the hole to said upper and lower surfaces of said insulating film; and
cutting said insulating film into a predetermined configuration so as to make a plurality of find wiring substrates.

BRIEF DESCRIPTION OF THE DRAWINGS

FIG. 3 is a sectional view for explaining a method of removing burrs arisen at edges of the wiring substrate during the manufacture;

FIGS. 4A to 4C are enlarged sectional views of a main part of the wiring substrate for explaining the manufacturing steps after a treatment in FIG. 3;

FIGS. 5A to 5G are enlarged sectional views of a wiring substrate in each manufacturing step showing the second embodiment of the present invention; and FIGS. 6A to 6I are conceptional views explaining an applied system for FIGS. 1A to 1H of the present invention.

DETAILED DESCRIPTION OF THE PREFERRED EMBODIMENTS

First Embodiment

A method of manufacturing the present invention will be described hereinafter with reference to the accompanying drawings.

Figure 1A:
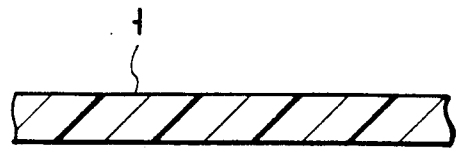
FIGS. 1A to 1H are enlarged sectional views of a main part of a wiring substrate in each manufacturing step, and show a method of manufacturing a double-sided wiring substrate according to the first embodiment of the present invention.
Figure 1B:
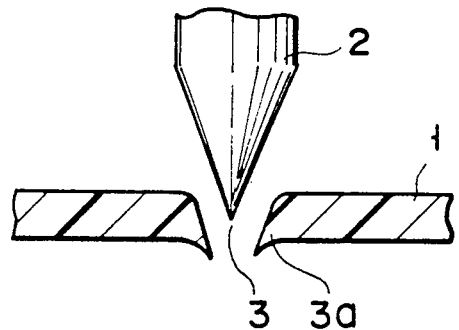
Figure 2A:
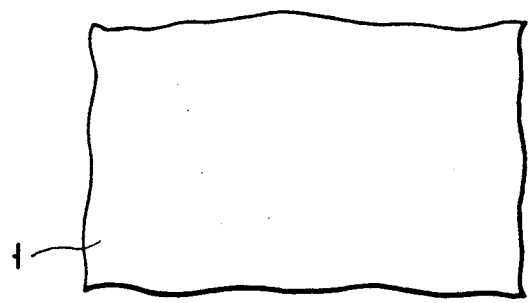
FIGS. 2A to 2H are plan views respectively corresponding to FIGS. 1A to 1H.
Figure 2B:
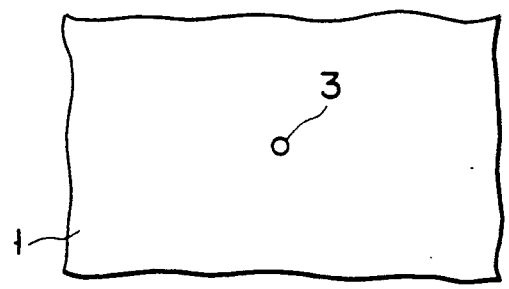

As shown in FIGS. 1A and 2A, an insulating film 1 is prepared. The insulating film 1 consists of a synthetic resin, e.g., polyimide, polyester or epoxy glass. As shown in FIGS. 1B and 2B, the insulating film 1 is pierced from its upper surface with a metal pin 2 to form a pin hole 3 which extends from the upper surface to the lower surface at a predetermined portion of the insulating film 1. In this case, e.g., a cotton needle No. 5 (the diameter of a thickest portion: 0.84 mm) is used as the pin 2 to cause its sharp distal end to form a tapered hole having a mean hole diameter of 0.1 to 0.4 mm. Note the pin hole 3 is formed by the pin 2, the insulating film 1 is directly pierced by the sharp distal end before a metal layer such as a copper layer is formed on the surface of the insulating film 1. Therefore, the distal end of the pin 2 is scarcely rounded.

Figure 1C:
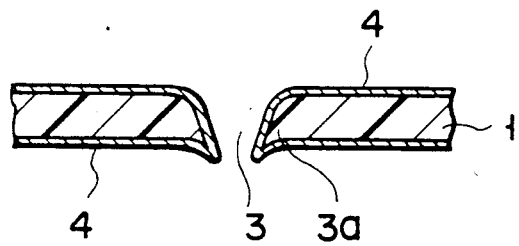
Figure 2C:
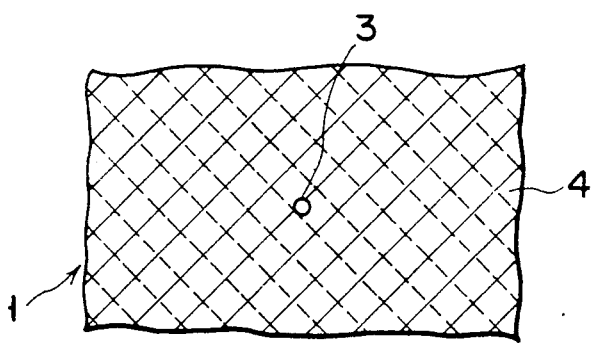

As shown in FIGS. 1C and 2C, a thin metal film 4 is formed on the upper and lower surfaces of the insulating film 1 and the inner wall of the pin hole 3 by vacuum deposition or sputtering. The thin metal film 4 consists of a metal such as copper (Cu) or aluminum (Al). The thickness of the thin metal film 4 is about several hundreds to several thousands Å. As described above, the pin hole 3 is tapered to be narrower toward its lower end. Therefore, when the thin metal film 4 is formed on the upper surface of the insulating film 1, metal particles are also adhered to the inner wall of the pin hole 3.

Therefore, the thin metal film 4 is continuously formed to cover the upper and lower surfaces of the insulating film 1 through the pin hole 3. In practice, vacuum deposition or sputtering is performed twice, i.e., to the upper and lower surfaces of the insulating film 1, as a matter of course. The thin metal film 4 is then adhered to the inner wall of the pin hole 3 in the two operations, thus realizing further reliable adhesion.

Figure 1D:
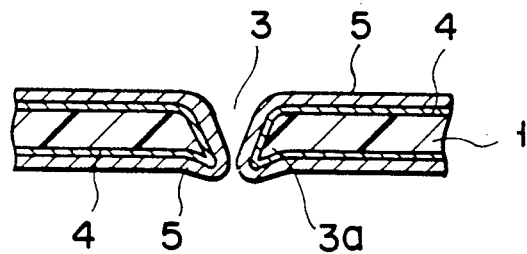
Figure 2D:
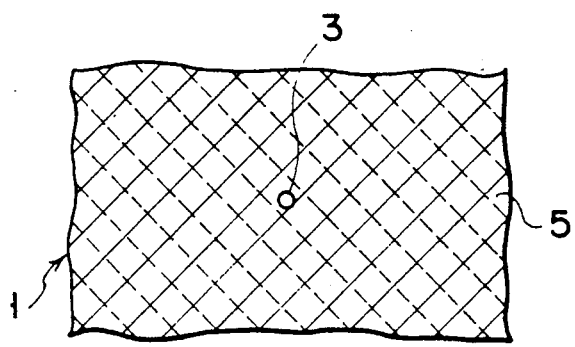

Thereafter, as shown in FIGS. 1D and 2D, a thick metal film 5 is formed on the entire surface of the thin metal film 4 by electroplating. The thick metal film 5 can be easily formed by electroplating because the thin metal film 4 serves as an undercoating electric plating layer. Although the material of the thick metal film 5 may be preferably the same as that of the thin metal film 4, it is not limited thereto. The thickness of the thick metal film 5 is about several to several tens gm. In this case, since the pin hole 3 is tapered to be narrower toward its lower end, metal particles can be successfully deposited to the thin metal film 4 formed on the inner wall of the pin hole 3, thus forming the thick metal film 5.

Figure 1E:
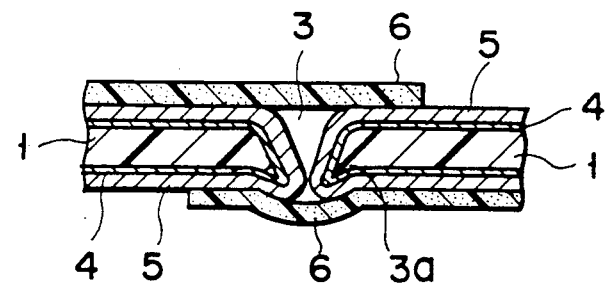
Figure 2E:
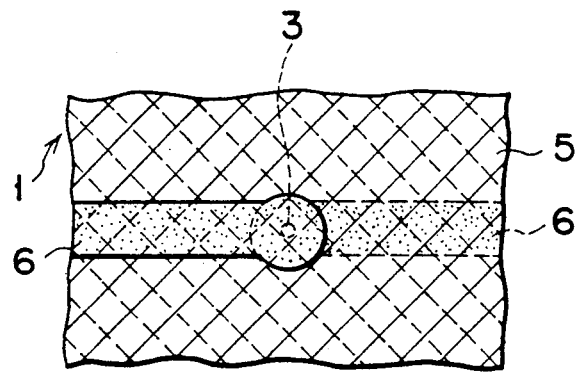

As shown in FIGS. 1E and 2E, a resist layer 6 is patterned on the surface of the thick metal film 5 formed on the upper and lower surfaces of the insulating film 1 by, e.g., a screen printing or a photolithography. In case the resist layer 6 is formed by a screen printing, a resist is printed on the thick metal film 5 through a screen to directly form a predetermined patterns of the resist layer 6 shown in FIG. 2E. In case the layer 6 is formed by a photolithography, the resist layer 6 is deposited on the entire surface of the insulating film 1, and a series of processing steps, i.e., masking, exposure, and developing are executed. Therefore, the predetermined patterns of the resist layer 6 shown in FIG. 2E is formed. A wet or dry resist film can be used as the resist in this case. However, the upper and lower regions of the pin hole 3 must be reliably covered with the resist layer 6.

Figure 1F:
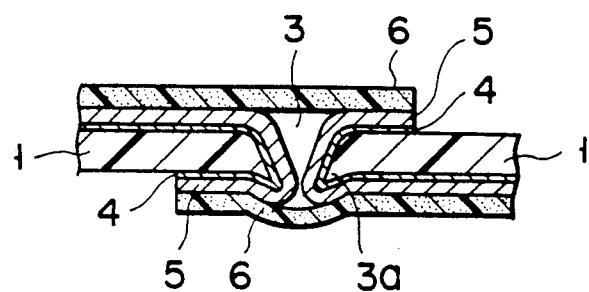
Figure 2F:
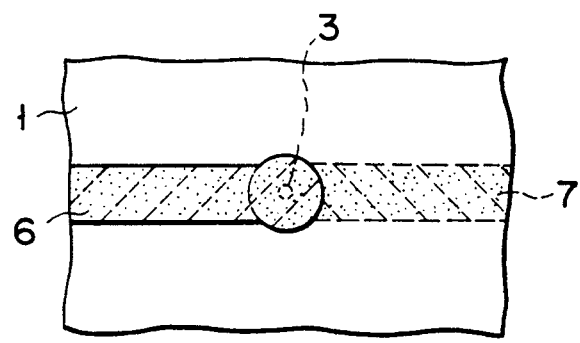

Thereafter, as shown in FIGS. 1F and 2F, the thick and the thin metal films 5 and 4 are etched by an etching solution using the resist layer 6 as a mask. Etching may be performed once when the materials of the thick and the thin metal films 5 and 4 are the same. In case these materials are different from each other, etching must be performed twice using another etching solution, as needed.

Figure 1G:
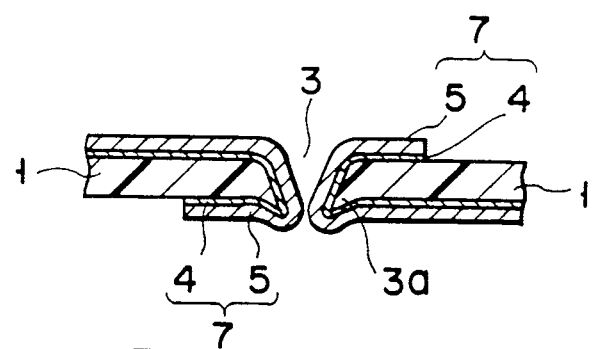
Figure 2G:
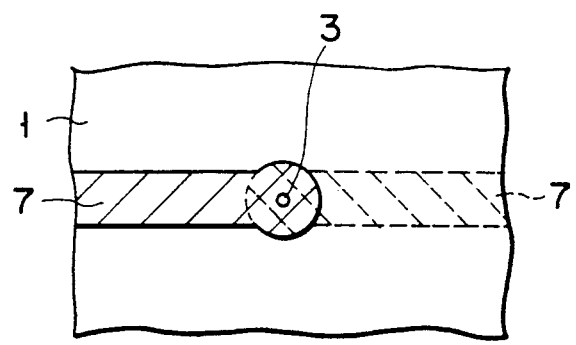

As shown in FIGS. 1G and 2G, when the resist layer 6 is removed, a two-layered wiring patterns 7 consisting of the thick and thin metal films 5 and 4 is formed on the upper and lower surfaces of the insulating film 1. The wiring patterns 7 is also formed on the inner wall of the pin hole 3, as a matter of course. Therefore, a double-sided wiring substrate wherein the wiring patterns 7 formed on the upper and surfaces of the insulating film 1 are electrically connected to each other through the pin hole 3 can be obtained.

Figure 1H:
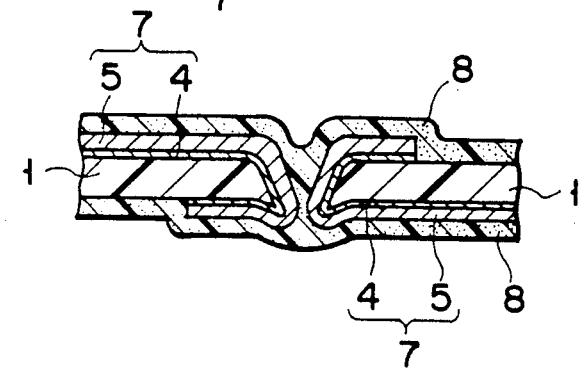
Figure 2H:
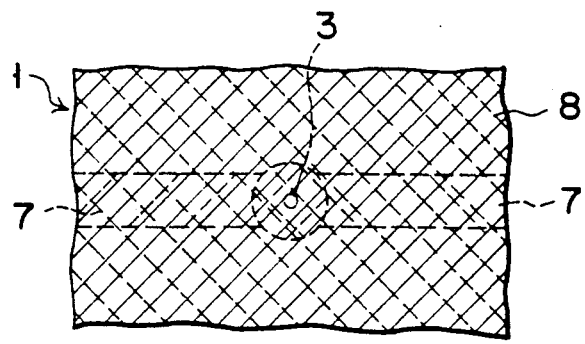

Thereafter, as shown in FIGS. 1H and 2H, an insulating film 8 is applied to the entire upper and lower surfaces of the insulating film 1 to cover the wiring patterns 7, thereby protecting the wiring patterns 7 and the thick and the thin metal films 5 and 4 in the pin hole 3 from corrosion.

In the above-mentioned method of manufacturing the double-sided wiring substrate, the pin hole 3 is formed prior to formation of the metal layer. Therefore, durability of a sharp distal end of the pin 2 is excellent to minimize a waste of time which occurs when the pin is exchanged. In addition, a resistivity of the thin and the thick metal films 4 and 5 is low, and these films can be efficiently formed. Furthermore, since the resist layer 6 and the wiring patterns 7 can be formed by a photolithography, extremely fine wiring can be effectively realized.

Note that, in the above embodiment, when the pin hole 3 is formed in the insulating film 1 by the pin 2, burrs 3a is formed at the lower end periphery of the pin hole 3 through which the pin 2 extends. Burrs 3a extends from the surface of the insulating film 1. Therefore, in the following step, i.e., the step of depositing a resist shown in FIG. 1E, a mask or screen member may float from the surface, and may not be brought into tight contact with the surface of the film 1.

FIG. 3 is a sectional view showing a processing step performed to solve the above problem. As shown in FIG. 1D, after the thin and the thick metal films 4 and 5 are formed on the inner wall of the pin hole 3 and the upper and lower surfaces of the insulating film 1, the insulating film 1 is sandwiched by a pair of upper and lower rollers 9 and is rolled, as shown in FIG. 3. Although rolling in this case is performed at a normal temperature, the insulating film 1 may be heated upon rolling. Thus, when the insulating film 1 is rolled, burrs 3a and the metal layer 7 on the surface are pushed into the pin hole 3, and are plastically deformed. Therefore, the periphery of the pin hole 3 on the lower surface side is smoothed to flatten the surface of the insulating film 1 and the metal layer 7, as shown in FIG. 4A.

For this reason, as shown in FIGS. 4B and 4C, resist formation and etching of the wiring patterns can be accurately performed.

Second Embodiment

The second embodiment of the present invention will be described hereinafter with reference to FIGS. 5A to 5G.

Figure 5A:
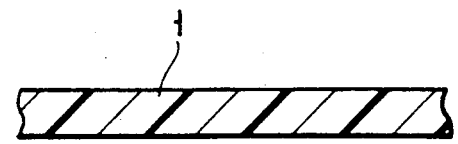
Figure 5B:
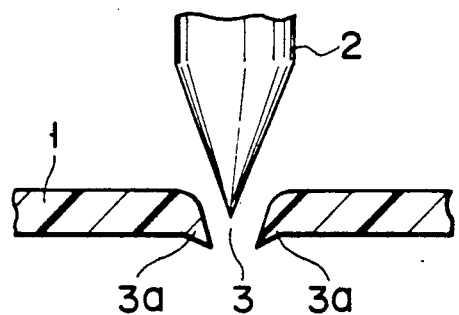

FIGS. 5A and 5B correspond to FIGS. 1A and 1B, respectively. Since the steps in FIGS. 5A and 5B have been described in the first embodiment, a description thereof will be omitted.

Figure 5C:
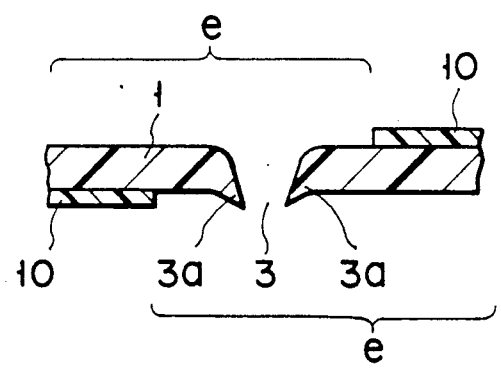

After a pin hole 3 is formed in an insulating film 1 by a pin 2, an insulating layer 10 is formed on the entire region on the upper and lower surfaces of the insulating film 1 except for a wiring pattern formation region e by a screen printing or a photolithography as shown in FIG. 5C. The insulating layer 10 consists of a hot melt resin or a resist such as a photoresist. In case the insulating layer 10 is formed by a screen printing, a resist is printed on the insulating film 1 through a screen to form the insulating layer 10. In case the insulating layer 10 is formed by a photolithography, a photoresist is applied to the entire surface of the insulating film 1, and the photoresist is exposed and developed through a mask, thereby patterning the insulating layer 10.

Figure 5D:
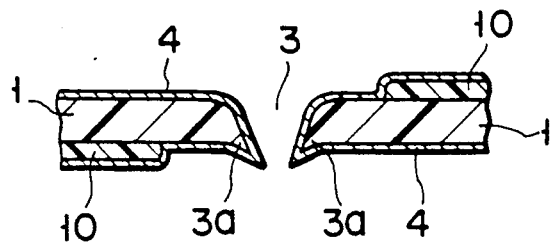

Subsequently, as shown in FIG. 5D, a thin metal film 4 is formed on the upper and lower surfaces of the insulating film 1 including the above-mentioned insulating layer 10, and the inner wall of the pin hole 3 by vacuum deposition or sputtering. The thin metal film 4 is also formed on burrs 3a arisen at the periphery of the pin hole 3 on the lower surface side.

As shown in FIG. 5E, the insulating layer 10 is peeled to remove the thin metal film 4 formed on the region except for the wiring pattern formation region e. More specifically, when the insulating layer 10 is peeled, the insulating layer 10 is heated and melted or etched to be removed. When the insulating layer 10 is etched, an edge or a part of the thin metal film 4 on the insulating film 10 is removed in advance. Thus, when the insulating layer 10 is removed, unnecessary portions of the thin metal film 4 are removed upon removal of the layer 10, and the thin metal film 4 is left in only the wiring pattern formation region e.

Thereafter, as shown in FIG. 5F, a thick metal film 5 is formed on the entire surface of the thin metal film 4 by electroplating. The thick metal film 5 can be easily formed on only the surface of the thin metal film 4 by electroplating because the thin metal film 4 serves as an undercoating electroplating layer. However, the metal thick film 5 is not formed on a region of the insulating film 1 from which the insulating layer 10 is peeled. Thus, wiring patterns 7 electrically connected to each other through the pin hole 3 are formed on the upper and lower surfaces of the insulating film 1.

In the next step shown in FIG. 5G, burrs 3a formed on the lower surface side of the pin hole 3 is rolled and is pushed into the pin hole 3 to flatten the surface. In this case, in the same manner as in the first embodiment, as shown in FIG. 3, the insulating film 1 is sandwiched by a pair of upper and lower rollers 9, and is rolled. Although rolling in this case is also performed at a normal temperature, the insulating film 1 may be heated upon rolling. Thus, when the insulating film 1 is rolled, the burrs 3a and the wiring patterns 7 are pushed into the pin hole 3. Therefore, the periphery of the pin hole 3 on the lower surface side is smoothed to flatten the surface of the insulating film 1 and the metal layer 7.

Thereafter, the entire surface may be covered with a protective film, if necessary.

Note that the present invention is not limited to the above embodiments, and various changes and modifications can be made. For example, in the above embodiments, the thin and the thick metal films 4 and 5 are dipped into an etching solution and are etched. However, unnecessary portions of the thin and the thick metal films 4 and 5 may be removed by dry etching such as reactive ion etching using a reactive gas. If, e.g., solder or gold (Au) which hardly corrode is used as a metal material for the thick metal film 5, the insulating film 8 for protection is not necessary. In addition, the thin metal film 4 need not always have a one-layered structure, and a multi-layered structure may be achieved. The number of pin holes 3 is not limited to one, and a plurality of pin holes may be formed to improve reliability of connection. Note that the insulating film may be surface-treated, or a proper coating material may be applied of the insulating film. A plurality of laminated insulating films can be used. In addition, the double-sided wiring substrate in this invention is not limited to the above-described embodiments. For example, a wiring substrate wherein only a wiring pattern, for connecting substrates to each other, for connecting a substrate to an electric part, or for connecting electric parts to each other, is formed, i.e., a so-called flexible connector, is included in the double-sided wiring substrate in the present invention.

An Applied System for First and Second Embodiments

An extensive system of manufacturing a double-sided wiring substrate, wherein two reels are used to increase the efficiency of the manufacturing of the substrate, will now be described with reference to FIGS. 6A to 6I.

Details of the main parts of the substrate made by this system are identical to those shown in FIGS. 1A to 1H and FIG. 2A to 2H.

First, as is shown in FIG. 6A, an insulating film 1, tens to hundreds meters long, is taken up around a first reel, thus forming a roll 10a thereon. Then, as is shown in FIG. 6B, the film 1 is intermittently fed from the roll 10a to a second reel, passing under a hole-forming machine 11 located between the first and second reels. Every time the insulating film 1 stops for some time, the device 11 is lowered onto the film 1, whereby the pins of the device 11 make pin holes in that portion of the film 1 which now contacts the device 11. Then, the device 11 is lifted from the film 1, and the film 1 is fed forward. When all film 1 is taken up around the second reel, now having pin holes and made into a roll 10b.

Then, the roll 10b is removed from the second reel, and placed in a sputtering device 12. The film 1 is fed from the roll 10b intermittently to a reel, passing through a gas-discharge chamber 12a. A substrate table 13 and a target 14 are located within the chamber 12a. The table 13 is electrically grounded. The target 14 is coupled to a matching circuit 15, which is arranged outside the chamber 12a and is connected to a radio frequency generator 16 also located outside the chamber 12a. Every time the film 1 stops for some time, glow discharge is performed in the gas-discharge chamber 12a, whereby ions emitted from the target 14 sputtered by self bias are deposited on the insulation film 1, thus forming a thin metal film 4 which is identical to the one shown in FIG. 1C. Upon forming the metal film 4 on that portion of the film 1 which is located within the chamber 12a, the film 1 is further fed and taken up around a reel. As the film 1 is further fed repeatedly, and the glow discharge is repeated in the chamber 12a, the film 1 coated with the metal film 4 is taken up around the reel, forming a roll 10c.

Next, as is shown in FIG. 6D, the film 1 is intermittently fed from the roll 10c to a reel, passing through the plating liquid 17a filled in a tank 17. More precisely, the insulating film 1 passes through the gap between an anode 17b and a cathode 17c, both immersed in the liquid 17a. Electroplating is performed on the film 1, thus forming a thick metal film 5, which is identical to the one shown in FIG. 1D, on the insulating film 1, and made into a roll 19d.

Figure 6E:
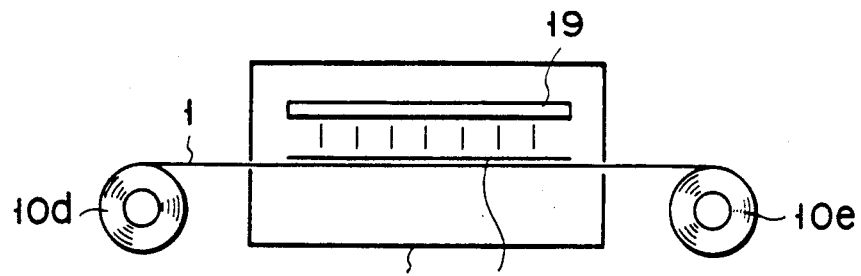

Thereafter, the thick metal film 5 is made flat in the step which has been described with reference to FIG. 3. A resist layer 6 is formed on the film 5 by a known method. Then, as is illustrated in FIG. 6E, the film 1 is fed from roll 10d through an exposure device 18, in which the light emitted from a light source 19 and passing through a mask 20 is applied to the resist layer 6. The film 1, with the resist layer 6 thus exposed, is taken up around a reel, thus forming a roll 10e. Though not shown in the drawings, the resist layer 6 is developed and water-washed.

Figure 6F:
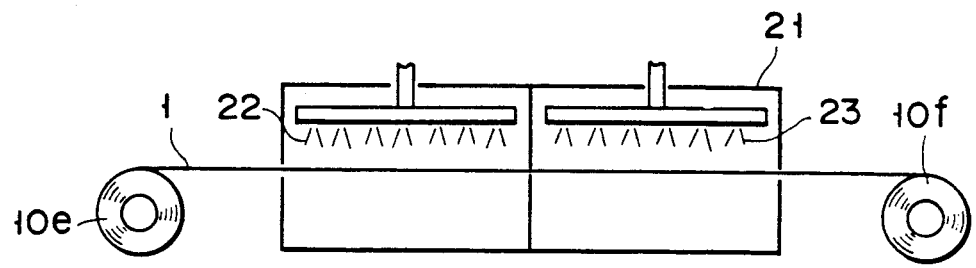

Then, as is shown in FIG. 6F, both the thin metal film 4 and the thick metal film 5 are etched with etchant 22 in an etching device 21, as the film 1 is fed from the roll 10e to a reel. The film 1 is then washed with water and dried, though not illustrated in the drawings, and then taken up around a reel, forming a roll 10F.

Figure 6G:
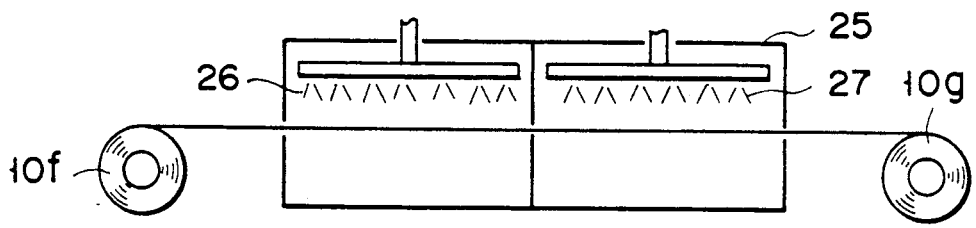

Next, as is shown in FIG. 6G, the resist layer 6 is etched with etchant 26 in an etching device 25 and washed with water 27, as the film 1 is fed from the roll 10e and taken up around a reel, forming a roll 10G.

Figure 6H:
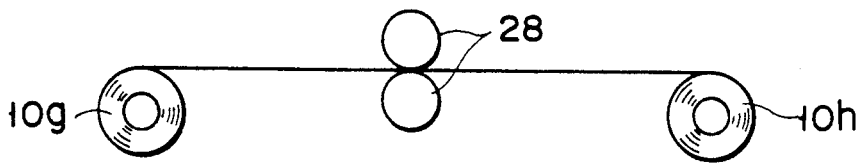

Further, as is shown in FIG. 6H, the film is fed from the roll 10G to a reel, passing through the gap between rolls 28, and roll-coated with an insulating film 8 which is identical to the one shown in FIG. 1H. The film 1, now with the film 8 coated on it, is taken up around the reel, forming a roll 10H.

Figure 6I:
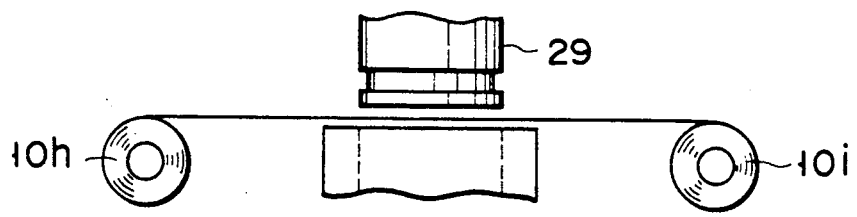

Finally, as is shown in FIG. 6I, two wiring substrates are formed, one on either side of the film 1, and then some portions of the film 1 are stamped out, as the film 1 is fed from the roll 10H and taken up around a reel, forming a roll 10I.

The system sit forth, which may be called "roll-to roll system," can also be applied to the method according to the second embodiment of the invention.

What is claimed is:

1. A method of manufacturing a double-sided wiring substrate comprising the steps of:
    providing an insulating film rolled up in a reel;
    unrolling and feeding intermittently said insulating film;
    forming a hole in said insulating film by a pin;
    forming a thin metal film on upper and lower surfaces of said insulating film and an inner wall of the hole by deposition;
    forming a thick metal film on said thin metal film by plating;
    etching a predetermined portion of said thin and thick metal films formed on said upper and lower surfaces of said insulating film to form a conductive patterns having a layered structure of said thin and thick metal films, said conductive patterns extending form said inner wall of the hole to said upper and lower surfaces of said insulating film; and
    cutting said insulating film into a predetermined configuration so as to make a plurality of final wiring substrates.

2. The method according to claim 1, wherein said cutting step is performed after said etching process.

3. The method according to claim 1, wherein a diameter of said hole formed in said insulating film by a pin is 0.1 to 0.4 mm.

4. The method according to claim 3, wherein said insulating film is polyester.

5. The method according to claim 4, wherein said thin metal film is formed of aluminum.

6. The method according to claim 1, wherein a thickness of said thin metal film is several hundreds to several thousands Å (angstrom).

7. The method according to claim 6, wherein said thin metal film is formed by sputtering.

8. The method according to claim 6, wherein said thick metal film is formed of aluminum.

9. The method according to claim 6, wherein a thickness of said thick metal film is several to several tens μm.

10. The method according to claim 9, wherein said thick metal film is formed by electroplating.

11. The method according to claim 10, wherein a diameter of said hole formed in said insulating film by a pin is 0.1 to 0.4 mm.

12. A method of manufacturing a double-sided wiring substrate comprising the steps of:
    providing an insulating film rolled up in a first reel;
    forming a hole in said insulating film by a pin, transferring said insulating film rolled up in said first reel to a second reel;
    forming a thin metal film on upper and lower surfaces of said insulating film and an inner wall of the hole by deposition, transferring said insulating film rolled up in said second reel to a third reel;
    forming a thick metal film on said thin metal film by plating, transferring said insulating film rolled up in said third reel to a fourth reel;
    etching a predetermined portion of said thin and thick metal films formed on said upper and lower surfaces of said insulating film to form a conductive patterns having a layered structure of said thin and thick metal films, and conductive patterns extending form said inner wall of the hole to said upper and lower surfaces of said insulating film, transferring said insulating film rolled up in said fourth reel to a fifth reel; and
    cutting said insulating film into a predetermined configuration so as to make a plurality of final wiring substrates, unrolling said insulating film rolled up in said fifth film.

* * * * *